United States Patent
Campanella-Pineda et al.

(10) Patent No.: US 10,358,340 B2
(45) Date of Patent: Jul. 23, 2019

(54) INTEGRATED CIRCUITS HAVING SHIELDED MEMS DEVICES AND METHODS FOR FABRICATING SHIELDED MEMS DEVICES

(71) Applicant: Globalfoundries Singapore Pte. Ltd., Singapore (SG)

(72) Inventors: Humberto Campanella-Pineda, Singapore (SG); Rakesh Kumar, Singapore (SG); Zouhair Sbiaa, Singapore (SG); Nagarajan Ranganathan, Singapore (SG); Ramachandramurthy Pradeep Yelehanka, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 19 days.

(21) Appl. No.: 15/140,906

(22) Filed: Apr. 28, 2016

(65) Prior Publication Data

US 2017/0313577 A1    Nov. 2, 2017

(51) Int. Cl.
*H01L 23/552* (2006.01)
*B81B 7/00* (2006.01)
*H01L 23/522* (2006.01)

(52) U.S. Cl.
CPC .......... *B81B 7/0064* (2013.01); *B81B 7/0022* (2013.01); *H01L 23/522* (2013.01)

(58) Field of Classification Search
CPC ... B81B 7/0069; B81B 7/0064; B81B 7/0022; B81C 1/00333; B81C 1/00325; B81C 1/00277; B81C 1/00301; B81C 2203/0136

(Continued)

(56) References Cited

U.S. PATENT DOCUMENTS

| | | | |
|---|---|---|---|
| 5,216,490 A | * | 6/1993 | Greiff ................... B81B 3/0086 257/415 |
| 5,864,260 A | | 1/1999 | Lee |

(Continued)

FOREIGN PATENT DOCUMENTS

| | | |
|---|---|---|
| CN | 104966703 A | 10/2015 |
| WO | 2010092399 A2 | 8/2010 |

OTHER PUBLICATIONS

Taiwanese Intellectual Property Office, Search Report for Taiwanese Patent Application No. 105117713 dated Sep. 7, 2017.

(Continued)

*Primary Examiner* — Kevin M Picardat
(74) *Attorney, Agent, or Firm* — Lorenz & Kopf, LLP

(57) ABSTRACT

Integrated circuits having shielded micro-electromechanical system (MEMS) devices and method for fabricating shielded MEMS devices are provided. In an example, an integrated circuit having a shielded MEMS device includes a substrate, a ground plane including conductive material over the substrate, and a dielectric layer over the ground plane. The integrated circuit further includes a MEMS device over the ground plane. Also, the integrated circuit includes a conductive pillar through the dielectric layer and in contact with the ground plane. The integrated circuit includes a metallic thin film over the MEMS device and in contact with the conductive pillar, wherein the metallic thin film, the conductive pillar and the ground plane form an electromagnetic shielding structure surrounding the MEMS device. Further, the integrated circuit includes an acoustic shielding structure over the substrate and adjacent the electromagnetic shielding structure.

20 Claims, 10 Drawing Sheets

(58) Field of Classification Search
USPC .................... 257/41, 659; 438/50, 51, 53
See application file for complete search history.

(56) References Cited

U.S. PATENT DOCUMENTS

| | | | |
|---|---|---|---|
| 6,492,759 B1* | 12/2002 | Watanabe | H03H 9/02086 |
| | | | 310/320 |
| 6,892,582 B1* | 5/2005 | Satou | B81C 1/00293 |
| | | | 361/283.1 |
| 7,233,218 B2 | 6/2007 | Park et al. | |
| 7,663,450 B2 | 2/2010 | Park et al. | |
| 7,670,861 B2* | 3/2010 | Hanaoka | B81C 1/00246 |
| | | | 257/E21.573 |
| 8,324,728 B2 | 12/2012 | Tabrizi | |
| 8,680,944 B2 | 3/2014 | Ye et al. | |
| 9,508,656 B2* | 11/2016 | Chiu | H01L 23/552 |
| 2004/0150939 A1* | 8/2004 | Huff | H01G 5/014 |
| | | | 361/277 |
| 2006/0214202 A1 | 9/2006 | Zorich et al. | |
| 2007/0024391 A1 | 2/2007 | Sul et al. | |
| 2008/0068697 A1* | 3/2008 | Haluzak | B81B 7/0067 |
| | | | 359/224.1 |
| 2010/0303271 A1* | 12/2010 | Wang | H04R 19/005 |
| | | | 381/355 |
| 2012/0086109 A1* | 4/2012 | Kim | H01L 21/561 |
| | | | 257/659 |
| 2013/0032385 A1* | 2/2013 | Lin | B81B 7/0058 |
| | | | 174/260 |
| 2015/0139467 A1* | 5/2015 | Park | H04R 19/04 |
| | | | 381/355 |

OTHER PUBLICATIONS

Chinese Patent and Trademark Office, Office Action for Chinese Patent Application No. 201710295681.2 dated Oct. 15, 2018.
Chinese Patent and Trademark Office, Search Report for Chinese Patent Application No. 201710295681.2 dated Sep. 30, 2018.

* cited by examiner

INTEGRATED CIRCUITS HAVING SHIELDED MEMS DEVICES AND METHODS FOR FABRICATING SHIELDED MEMS DEVICES

TECHNICAL FIELD

The technical field generally relates to Micro-Electro-Mechanical-Systems (MEMS) devices, and more particularly relates to integrated circuits with shielded MEMS devices and methods for fabricating shielded MEMS devices.

BACKGROUND

Commercial and technological trends are forcing tighter requirements for smaller radiofrequency (RF) devices, such as RF Micro-Electro-Mechanical-Systems (MEMS) devices, and for increased chip density. Such requirements lead to problems with signal integrity in cellular phone design. Signal integrity in the reduced-space of cellular phones is jeopardized by the proximity of RF devices, which promote strong electromagnetic (EM) and thermal coupling. To mitigate electromagnetic and thermal coupling, existing solutions separate the devices in the cellular phone through hybrid integration. It is theorized that shielding structures for monolithic radiofrequency filter duplexers can be utilized to reduce electromagnetic issues. Acoustic coupling will also degrade signal integrity of monolithic radiofrequency front-end modules.

Complex wafer bonding processes that involve at least a second cap wafer are typically employed to mitigate electromagnetic coupling, thermal coupling and acoustic coupling in radiofrequency front-end modules. These processes are expensive and time intensive. Further, such processes result in devices with a larger form factor and increased footprint as compare to desired dimensions.

Accordingly, it is desirable to provide a method for fabricating a shielded MEMS device. Further, it is desirable to provide an integrated circuit having a shielded MEMS device. Also, it is desirable to provide integrated circuits having MEMS devices with electromagnetic shielding structures and/or acoustic shielding structures. It is also desirable to provide methods for fabricating integrated circuits with shielding structures that provide for monolithic integration of the cap of the shielding structure, the shielded MEMS device, the ground plane of the shielding structure, and any underlying radiofrequency on semiconductor-on-insulator (RFSOI) circuit. Furthermore, other desirable features and characteristics will become apparent from the subsequent detailed description and the appended claims, taken in conjunction with the accompanying drawings and this background.

BRIEF SUMMARY

Integrated circuits having shielded micro-electromechanical system (MEMS) devices and method for fabricating shielded MEMS devices are provided. In an exemplary embodiment, an integrated circuit having a shielded MEMS device includes a substrate, a ground plane including conductive material over the substrate, and a dielectric layer over the ground plane. The integrated circuit further includes a MEMS device over the ground plane. Also, the integrated circuit includes a conductive pillar through the dielectric layer and in contact with the ground plane. The integrated circuit includes a metallic thin film over the MEMS device and in contact with the conductive pillar, wherein the metallic thin film, the conductive pillar and the ground plane form an electromagnetic shielding structure surrounding the MEMS device. Further, the integrated circuit includes an acoustic shielding structure over the substrate and adjacent the electromagnetic shielding structure.

Another embodiment includes an integrated circuit having a shielded MEMS device. The integrated circuit includes a substrate, a ground plane including conductive material over the substrate, and a dielectric layer over the ground plane. The integrated circuit includes a MEMS device over the ground plane and having a footprint. The integrated circuit further includes a dielectric material overlying the dielectric layer, outside the footprint, and patterned to form an acoustic shielding structure.

In another exemplary embodiment, a method for fabricating a shielded MEMS device includes providing a substrate and forming a ground plane including conductive material over the substrate. The method includes depositing a dielectric layer over the ground plane and forming a MEMS device over the ground plane. Further, the method includes forming a conductive pillar through the dielectric layer and in contact with the ground plane. Also, the method includes depositing a metallic thin film over the MEMS device and in contact with the conductive pillar, wherein the metallic thin film, conductive pillar and ground plane form an electromagnetic shielding structure surrounding the MEMS device.

Yet another embodiment provides a method for fabricating a shielded MEMS device. The method includes providing a substrate, forming a ground plane including conductive material over the substrate, and depositing a dielectric layer over the ground plane. The method further includes forming a MEMS device from a MEMS device layer over the ground plane, wherein the MEMS device has a footprint. The method includes patterning the MEMS device layer outside the footprint to form an acoustic shielding periodic structure.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
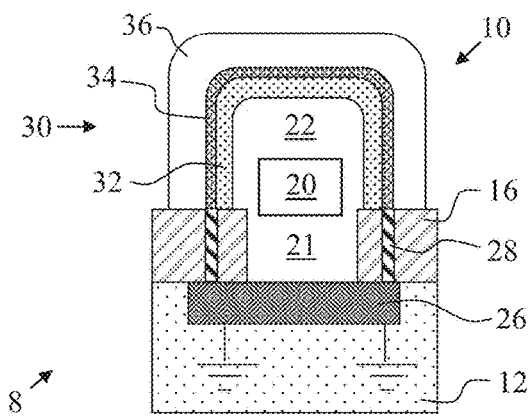
FIGS. 1-3, 5, 7, 10, 12-14, 16, and 18-21 illustrate, in cross section, exemplary embodiments of shielded MEMS devices.

The following detailed description is merely exemplary in nature and is not intended to limit the integrated circuits with shielded MEMS devices and methods for fabricating shielded MEMS devices. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and process steps described herein may be incorporated into a more comprehensive procedure or process having additional steps or functionality not described in detail herein. In particular, various steps in semiconductor processing and the fabrication of MEMS devices are well-known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "lower", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As described herein, a method is provided for forming a shielded MEMS device over a substrate by processing a single substrate. Specifically, all layers deposited and elements formed are deposited and formed over and on the same substrate. The MEMS device and shielding structures are formed over a single substrate and the process does not necessitate bonding a cap wafer or other second substrate to form the MEMS device or shielding structures. In other words, the fabrication method provides for monolithic integration of the upper portion or cap of the shielding structure, the shielded MEMS device, the ground plane of the shielding structure, and any underlying complementary metal oxide semiconductor (CMOS) device or RFSOI circuit.

Further, the shielded MEMS devices may be provided with one or two types of shielding structures. An exemplary shielded MEMS device is encapsulated in all directions (x, y, and z, with reference to the Cartesian coordinate system) by an electromagnetic shielding structure. Another exemplary shielded MEMS device is enclosed in horizontal direction (x) by an acoustic shielding structure. Further embodiments provide for a shielded MEMS device that is encapsulated in all directions (x, y, and z) by an electromagnetic shielding structure and that is enclosed in horizontal direction (x) by an acoustic shielding structure.

Figure 2:
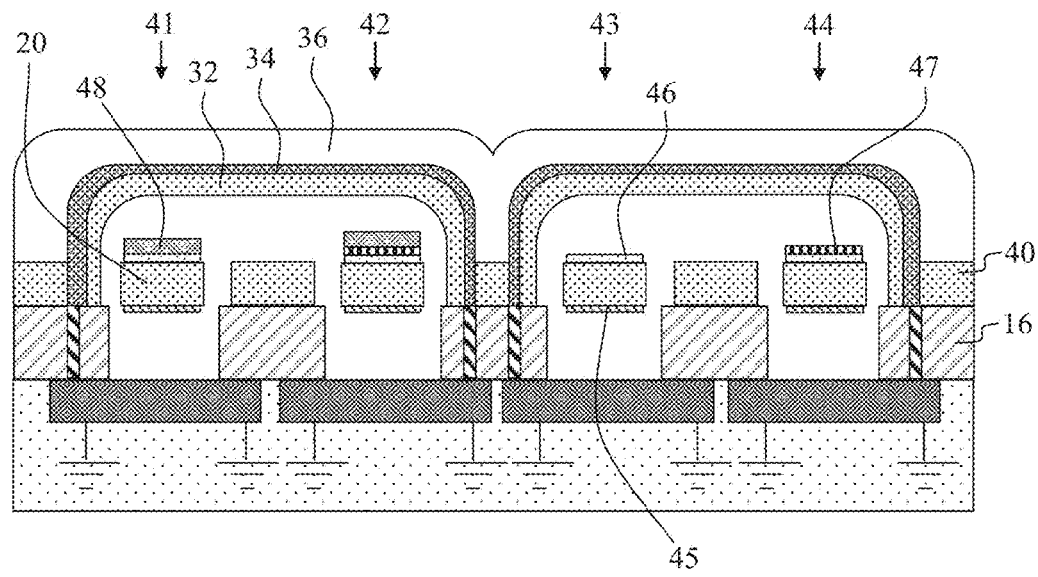
Figure 3:
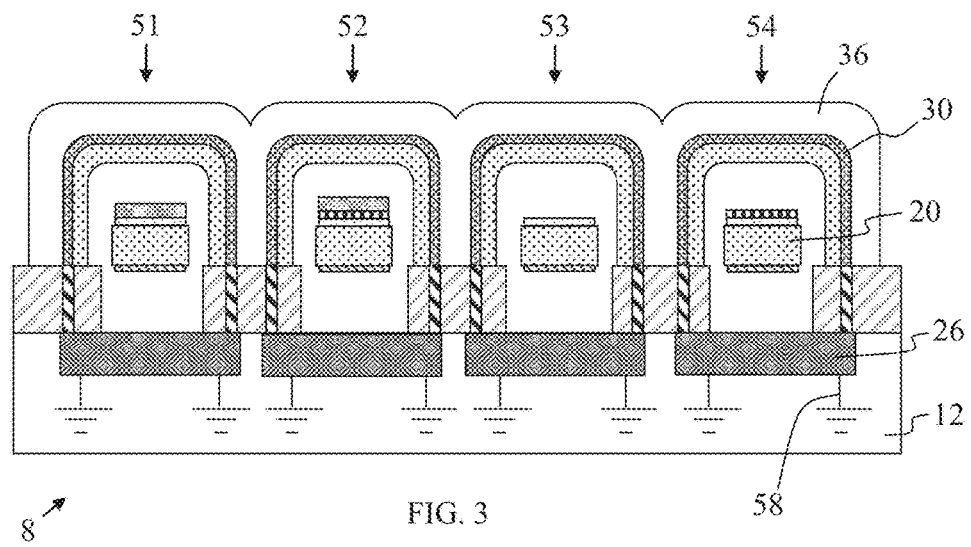
Figure 4:
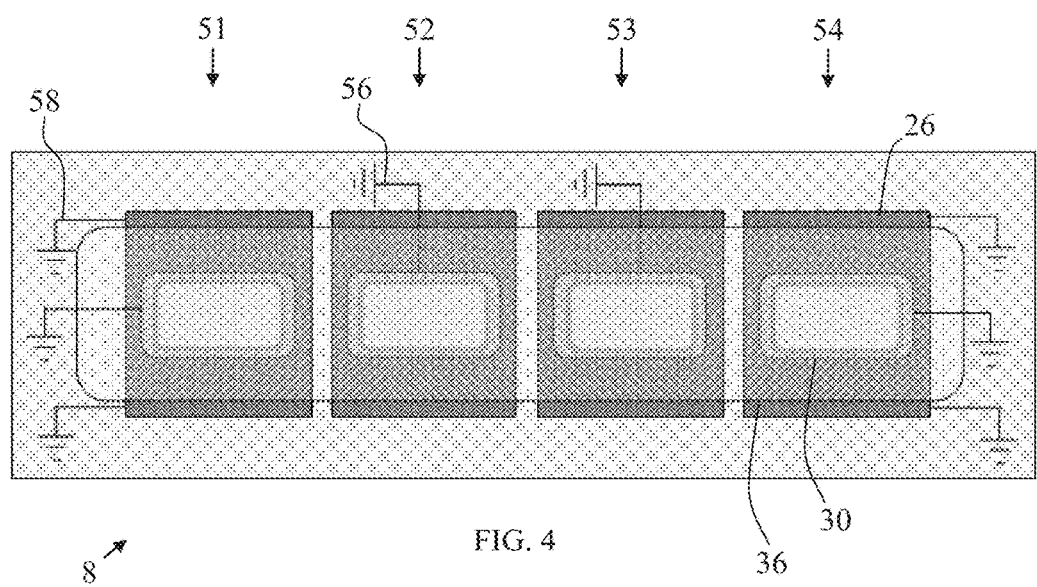
FIGS. 4, 6, 8, 9, 11, 15 and 17 are overhead schematics of the exemplary embodiments of shielded MEMS devices shown in FIGS. 3, 5, 7, 9, 14 and 16, respectively.
Figure 5:
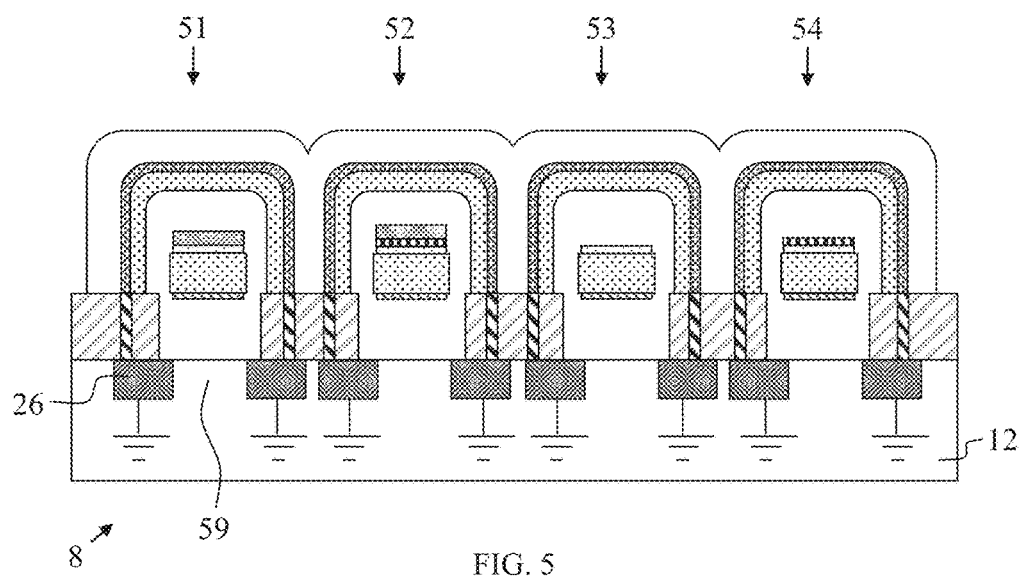
Figure 6:
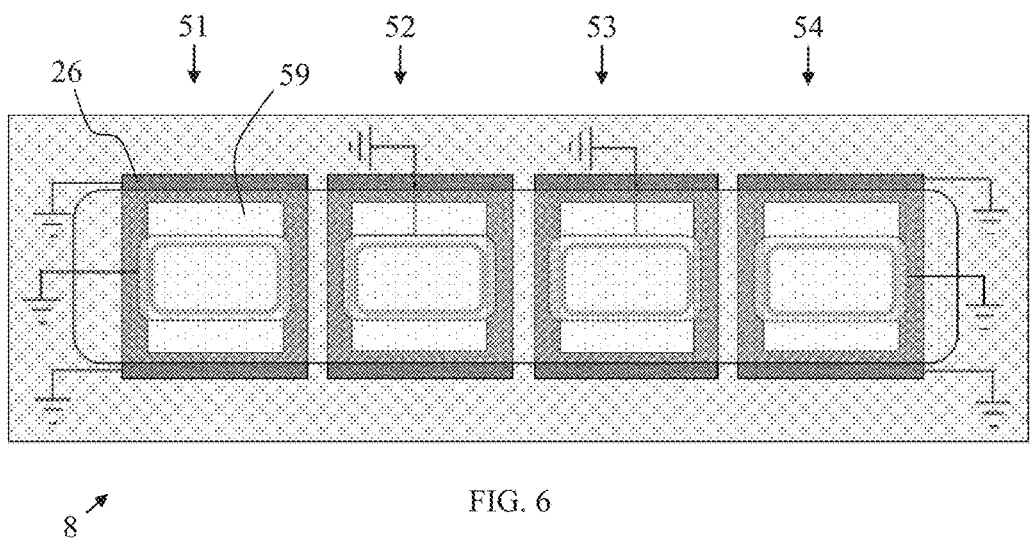
Figure 7:
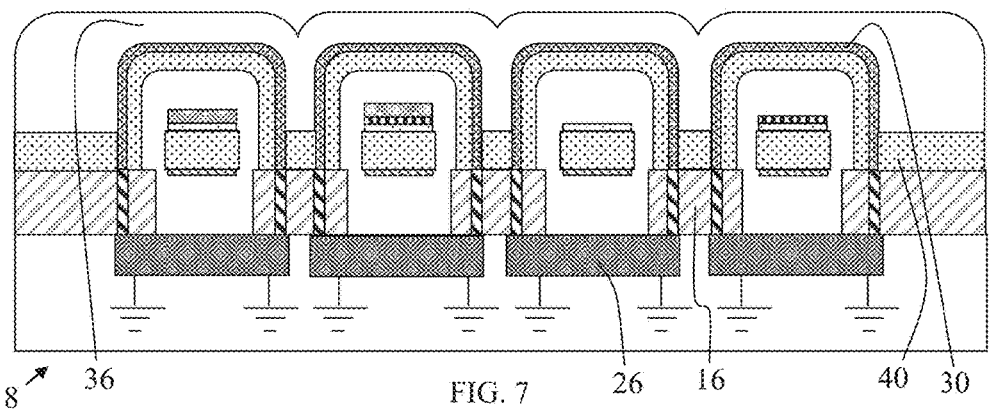
Figure 8:
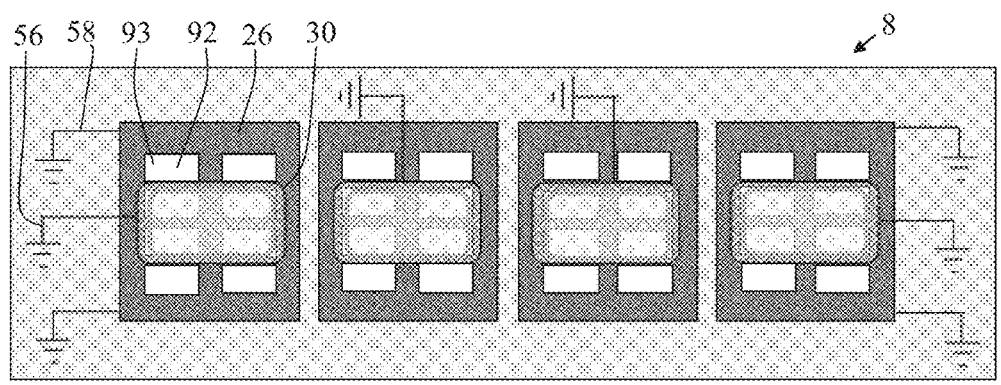
Figure 9:
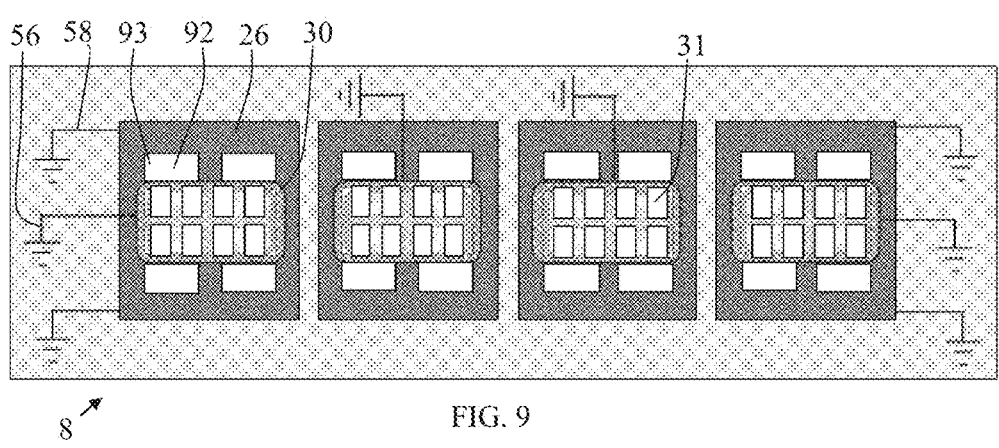
Figure 10:
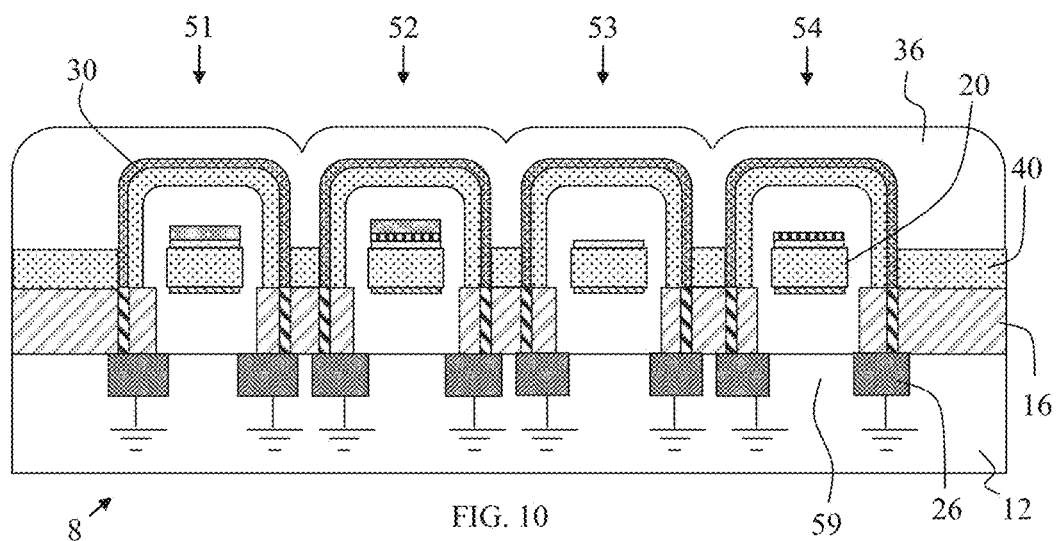
Figure 11:
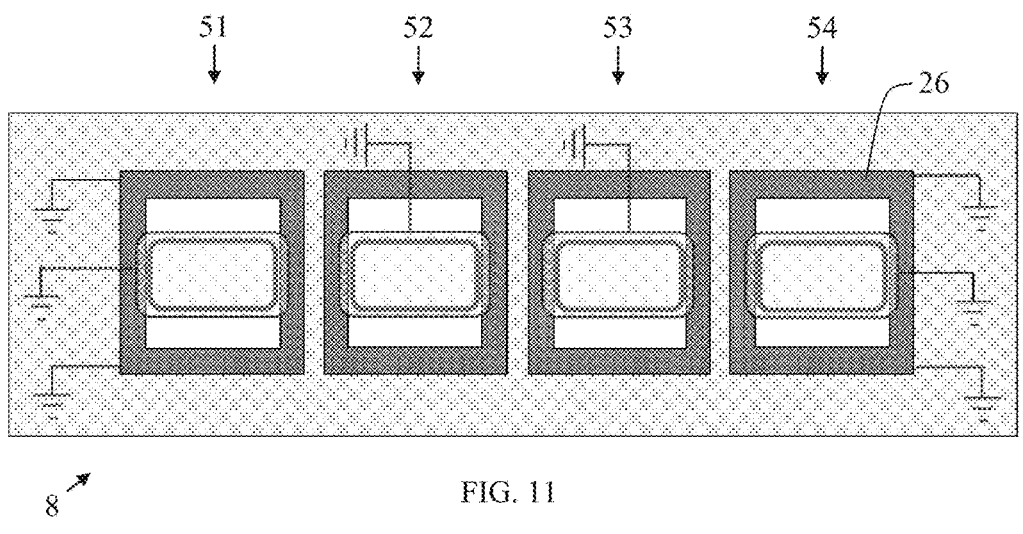
Figure 12:
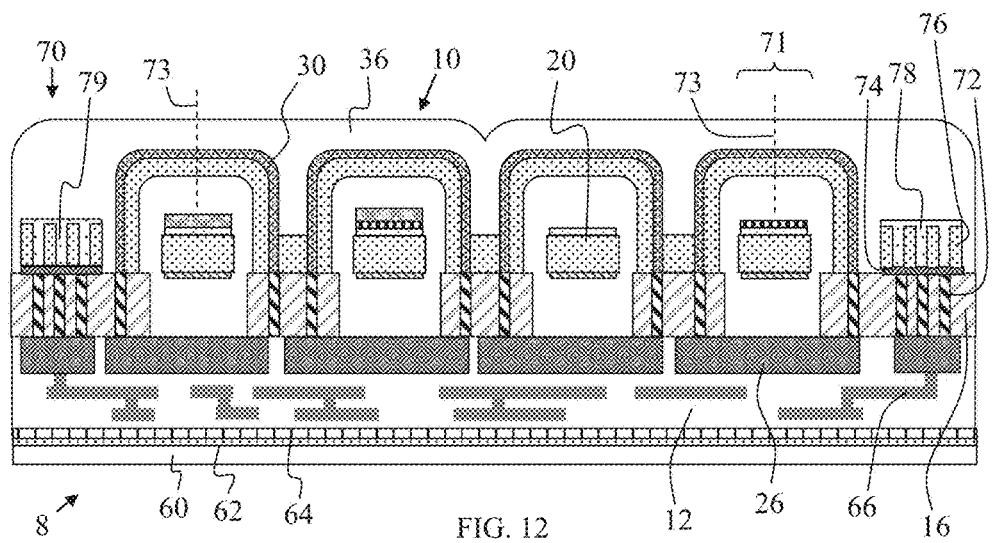
Figure 13:
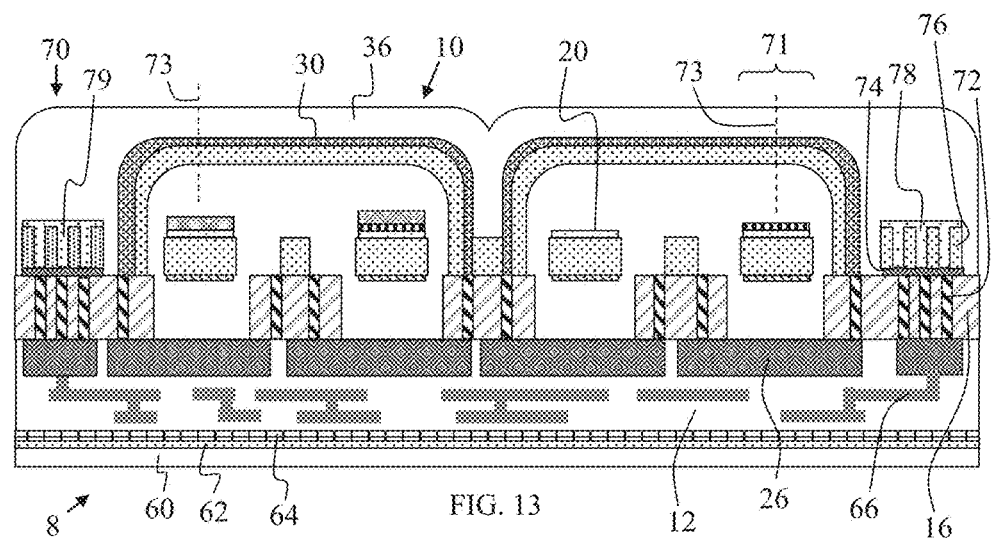
Figure 14:
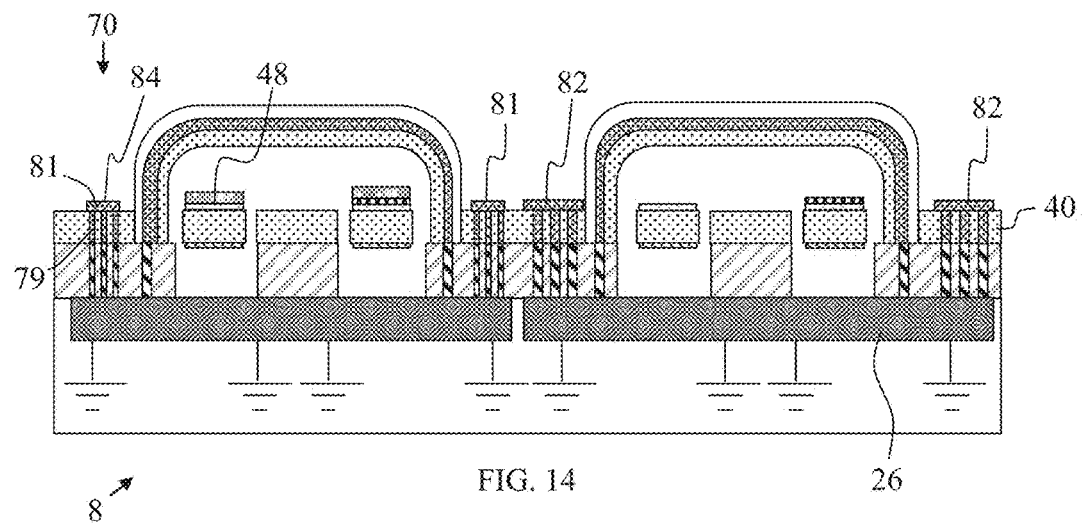
Figure 15:
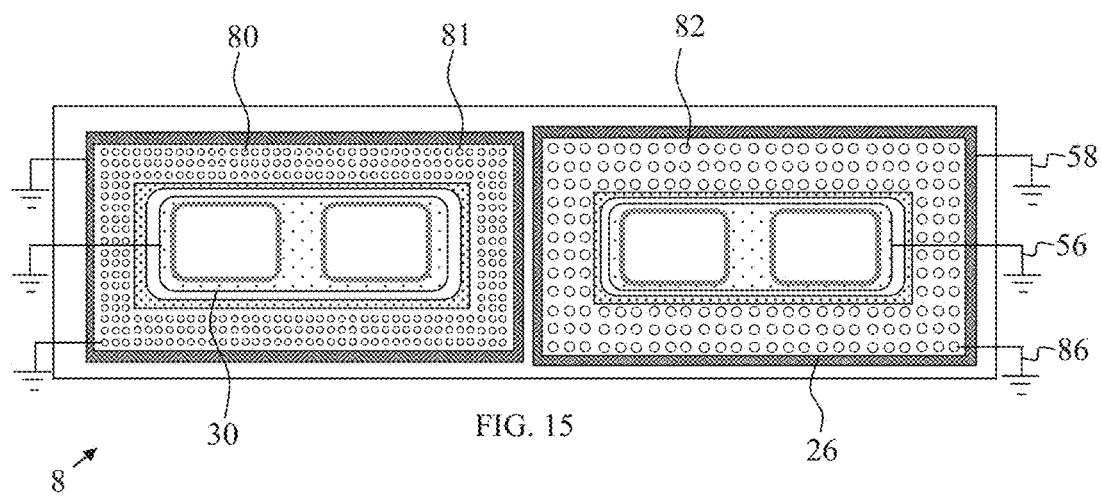
Figure 16:
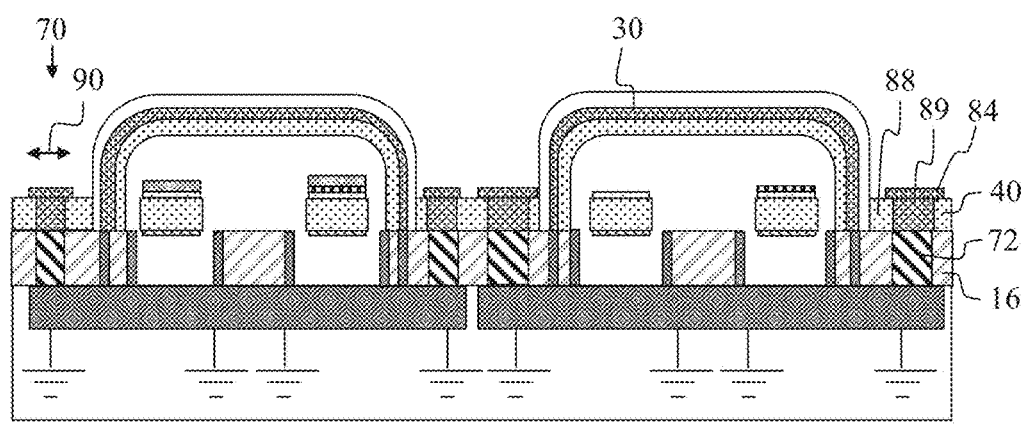
Figure 17:
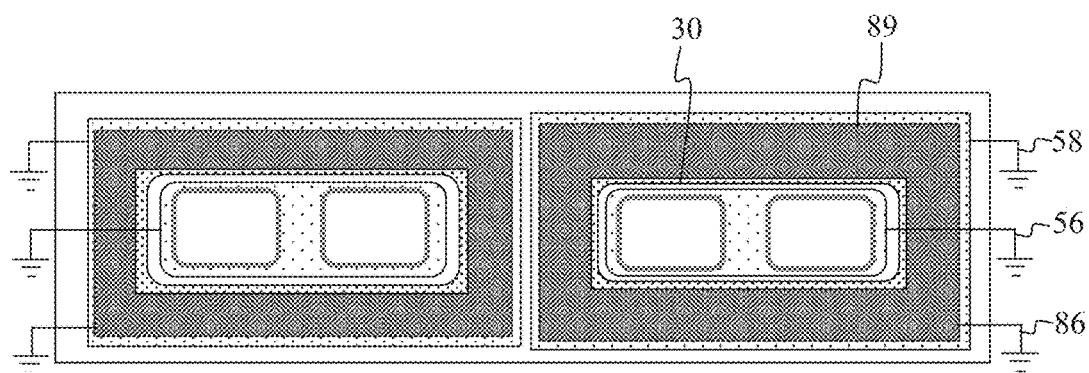
Figure 18:
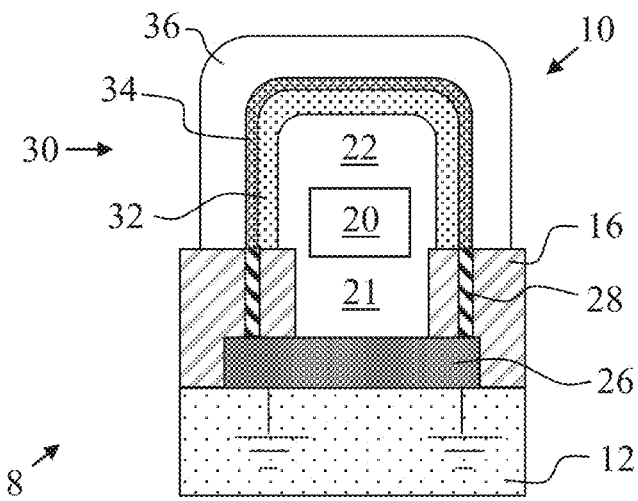
Figure 19:
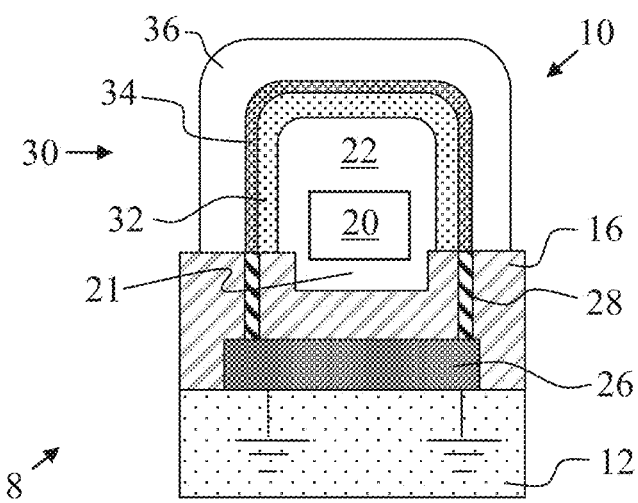
Figure 20:
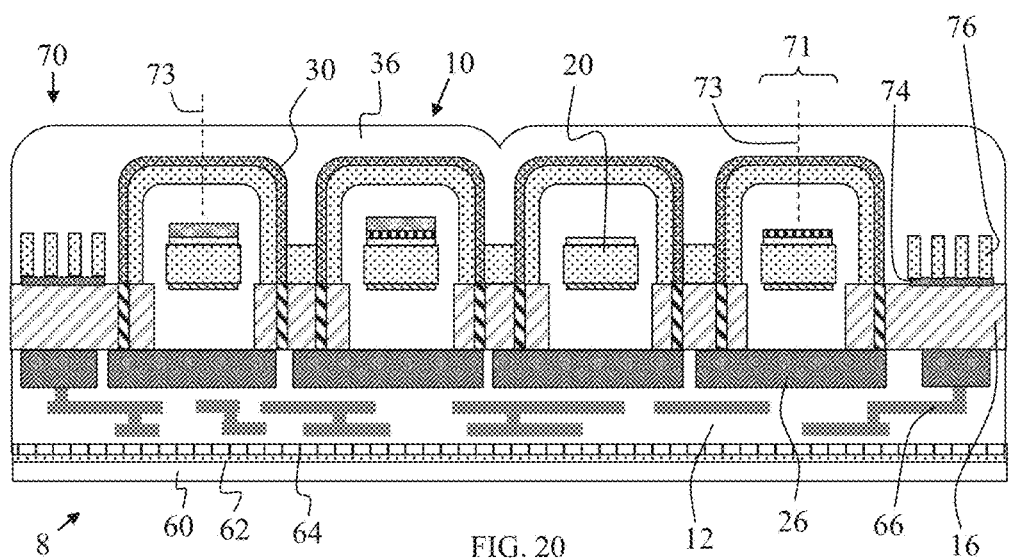
Figure 21:
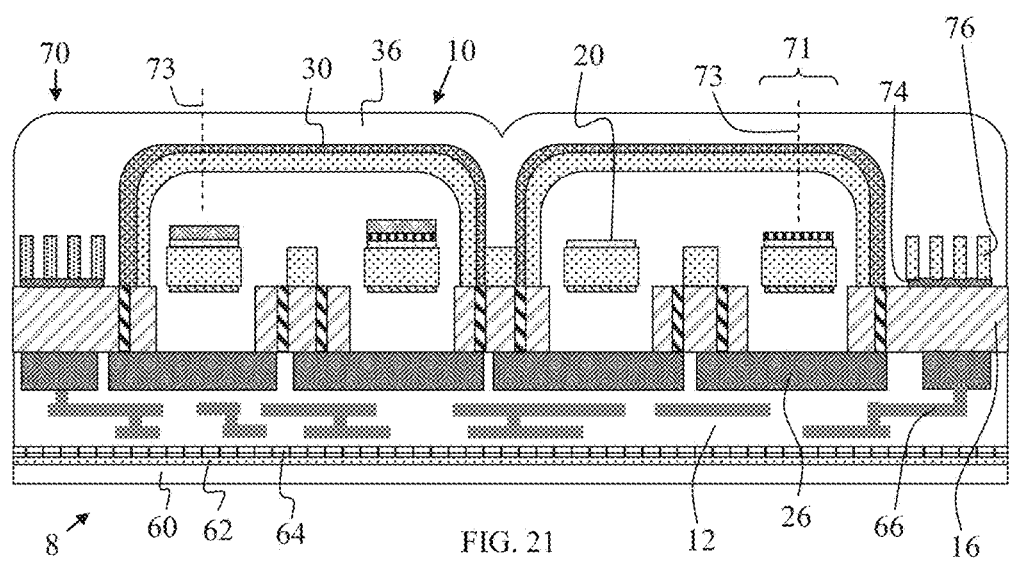

FIGS. 1, 18 and 19 illustrate embodiments of an integrated circuit with a single shielded MEMS device provided with an electromagnetic shield. FIG. 2 illustrates an embodiment of an integrated circuit with a pair of shielded MEMS systems, each including two shielded MEMS devices, with both provided with an electromagnetic shield. FIGS. 3 and 4 illustrate an embodiment of an integrated circuit with four MEMS devices provided with individual electromagnetic shields, each including a solid block ground plane. FIGS. 5 and 6 illustrate an embodiment of an integrated circuit with four MEMS devices provided with individual electromagnetic shields, each including an annular ground plane. FIGS. 7-9 illustrate an embodiment of an integrated circuit with four MEMS devices provided with individual electromagnetic shields and blanket deposited dielectric and sealing layers, each including a cage-shaped ground plane with either a solid continuous or cage-shaped electromagnetic shield. FIGS. 10 and 11 illustrate an embodiment of an integrated circuit with four MEMS devices provided with individual electromagnetic shields and blanket deposited dielectric and sealing layers, each including an annular ground plane. FIGS. 12 and 20 illustrate embodiments of an integrated circuit with four MEMS devices formed over an RFSOI substrate and provided with individual electromagnetic shields and blanket deposited dielectric and sealing layers, wherein the four MEMS devices are collectively shielded by an acoustic shielding structure. FIGS. 13 and 21 illustrate embodiments of an integrated circuit with four MEMS devices formed over an RFSOI substrate and blanket deposited dielectric and sealing layers, wherein two electromagnetic shields encapsulate a pair of MEMS devices, and wherein the four MEMS devices are collectively shielded by an acoustic shielding structure. FIGS. 14 and 15 illustrate an embodiment of an integrated circuit with four MEMS devices, wherein two electromagnetic shields encapsulate a pair of MEMS devices, and wherein two acoustic shielding structures are provided as periodic structures, such that an acoustic shielding structure is dedicated to shielding each pair of MEMS devices. FIGS. 16 and 17 illustrate an embodiment of an integrated circuit with four MEMS devices, wherein two electromagnetic shields encapsulate a pair of MEMS devices, and wherein two acoustic shielding structures are provided as annular block structures, such that an acoustic shielding structure is dedicated to shielding each pair of MEMS devices.

In FIGS. 1, 18 and 19 a portion of an integrated circuit 8 is formed with an exemplary shielded Micro-Electro-Mechanical-Systems (MEMS) device 10. As shown, the shielded MEMS device 10 is formed over a substrate 12, such as a semiconductor substrate. It is to be appreciated that various fabrication techniques may be conducted in accordance with the methods described herein to form the semiconductor substrate 12 as shown. Herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor substrate 12 may include a compound semiconductor such as silicon carbide, silicon germanide, gallium arsenide, indium arsenide, indium gallium arsenide, indium gallium arsenide phosphide, or indium phosphide and combinations thereof. In an exemplary embodiment, the semiconductor material is a silicon substrate. As referred to herein, a material that includes a recited element/compound includes the recited element/compound in an amount of at least 25 weight percent based on the total weight of the material unless otherwise indicated.

The semiconductor substrate 12 may be a bulk wafer, such as a silicon bulk wafer, or a semiconductor-on-insulator (SOI) substrate, such as an RFSOI substrate, or another substrate that may be suitable for housing MEMS devices. In FIG. 1, the illustrated substrate 12 is a bulk wafer. As shown, a MEMS device fabrication process has been performed in accordance with conventional techniques. Specifically, a dielectric layer 16 has been formed over the substrate 12. An exemplary dielectric layer 16 is silicon oxide or silicon nitride. In an exemplary embodiment, the dielectric layer 16 has a thickness of at least about 3 µm, such as from about 3 to about 10 µm. Further, a MEMS structure 20 has been formed and patterned over the substrate 12. The MEMS structure 20 may include any suitable layers and structure, including for example, a molybdenum, aluminum nitride, molybdenum (Mo/AlN/Mo) stack. As shown, the MEMS structure 20 is formed with a lower cavity 21 separating the MEMS structure 20 from the substrate 12. Further, the MEMS structure 20 is formed with an upper cavity 22 overlying and beside the MEMS structure 20. The upper cavity 22 and lower cavity 21 isolate the MEMS structure 20. As fabricated, the MEMS structure 20 is capable of physical movement, i.e., vibration, within the lower cavity 21 and upper cavity 22. An exemplary MEMS structure 20 may be an accelerometer including a suspended structure such as a cantilever, diaphragm, or other MEMS structure.

In FIGS. 1, 18 and 19 a ground plane 26 is formed from conductive material. An exemplary ground plane 26 is formed from a metal, such as aluminum. The ground plane 26 may be formed according to conventional processing. For example, in FIG. 1, the substrate 12 may be etched to form a trench, and the trench may be filled by a conductive material deposition process, for example, physical vapor deposition (PVD). Alternate embodiments for forming the ground plane 26 are illustrated in FIGS. 18 and 19. In the embodiments of FIGS. 18 and 19, the substrate 12 is not etched to form a trench. Rather, the conductive material is deposited over the surface of the substrate 12 and is patterned to form the ground plane 26. In the embodiments of FIGS. 18 and 19, the dielectric layer 16 is deposited to cover the ground plane 26 substrate 12, thereby encapsulating the ground plane 26.

In FIG. 18, the central portion of the dielectric layer 16 lying over the ground plane 26 is completely etched and removed to form the lower cavity 21 in contact with the ground plane 26, similar to the embodiment of FIG. 1. In FIG. 19, the central portion of the dielectric layer 16 lying over the ground plane 26 is only partially etched to form the lower cavity 21 bounded only by the dielectric layer 16. It is contemplated that the dielectric layer 16 and lower cavity 21 structure of FIG. 19 may be used with the substrate-embedded ground plane 26 of FIG. 1.

In each of the embodiments of FIGS. 1, 18 and 19, vias are etched through the dielectric layer 16 and land on the ground plane 26. The vias are filled with a conductive material to form conductive pillars 28 that are electrically connected to the ground plane 26. In an exemplary embodiment, the conductive pillars 28 are metal, such as tungsten or copper, other suitable conductive materials, or a combination thereof.

Further, an electromagnetic (EM) shielding structure 30 is formed over the MEMS structure 20. Specifically, a dielectric shielding layer 32 is formed over the MEMS structure 20. The dielectric shielding layer 32 contacts the dielectric layer 16. As shown, the dielectric shielding layer 32 encloses the upper cavity 22 and encapsulates the MEMS structure 20.

The dielectric shielding layer 32 may be deposited over a sacrificial material that is removed to form the upper cavity 22. In an exemplary embodiment, the dielectric shielding layer 32 is a permeable material, such as thin titanium/titanium nitride (Ti/TiN) layers, aluminum copper/molybdenum (Al Cu/Mo) layers, silicon carbide (SiC), amorphous silicon (A-Si), or silicon nitride (SiN) such as silicon rich SiN. Use of permeable material may provide for removal of an underlying sacrificial layer without etching or otherwise forming an opening through the dielectric shielding layer 32 after deposition of the material forming the dielectric shielding layer 32. In other embodiments, the dielectric shielding layer 32 is aluminum nitride (AlN), or another suitable dielectric material used in MEMS fabrication processing including other nitrides and piezoelectric dielectric materials. In an exemplary process, the dielectric shielding layer 32 is formed from AlN that is deposited by reactive sputtering using a physical vapor deposition (PVD) process. In another exemplary embodiment, the dielectric shielding layer 32 is formed from permeable material that is deposited by sputtering or plasma enhanced CVD (PECVD). An exemplary dielectric shielding layer 32 has thickness of from about 0.01 to about 2 µm, such as from about 0.2 to about 0.5 µm.

As shown, a metallic shield layer 34 is formed over the dielectric shielding layer 32. The metallic shield layer 34 contacts and is electrically connected to the conductive pillars 28. As a result, the ground plane 26, conductive pillars 28 and metallic shield 34 form a conductive enclosure surrounding and encapsulating the MEMS structure 20.

An exemplary metallic shield layer 34 is a thin film. For example, the metallic shield layer 34 may have a thickness of 0.5 to 5 µm with a typical thickness of 1 µm. An exemplary metallic shield layer 34 is copper, aluminum, tungsten, titanium or another suitable metal, or a combination thereof. In an exemplary embodiment, the metallic shield layer 34 is formed by physical vapor deposition, electroplating or evaporation.

In each of the embodiments of FIGS. 1, 18 and 19, a sealing layer 36 is formed over the metallic shield layer 34. An exemplary sealing layer 36 is a polymeric material, or another dielectric material such as silicon oxide. In an exemplary embodiment, a polymer of tetrafluoroethylene (TFE), silicon nitride, silicon oxide or combinations of the above forms the sealing layer 36. An exemplary process for forming the sealing layer 36 is low-temperature plasma-enhanced chemical vapor deposition (PECVD) of silicon dioxide, or similar low-temperature process. As shown, the sealing layer 36 contacts the dielectric layer 16 and encapsulates the metallic shield layer 34. In an exemplary embodiment, the sealing layer 36 has a thickness of from about 1 to about 15 µm, such as about 10 µm.

The MEMS structure 20 in FIGS. 1, 18 and 19 may be a resonator that is individually shielded by the shielding structure 30. In practice, such MEMS structures 20 are fabricated adjacent one another and are shielded from one another with shielding structures, as shown below.

FIG. 2 illustrates an embodiment in which MEMS structures 20 are shielded at the system level, i.e., as filters or duplexers. More detail is provided regarding the formation of the MEMS structures 20 in FIG. 2. For example, each MEMS structure 20 is formed from a MEMS device layer 40 that is blanket deposited and patterned over the dielectric layer 16. An exemplary MEMS device layer 40 is aluminum nitride (AlN).

The MEMS structure 20 in each region 41, 42, 43, and 44 is formed with a bottom electrode 45. In conventional MEMS processing, a bottom electrode material is deposited over the dielectric layer 16 and patterned to form a bottom electrode 45 in each region 41, 42, 43 and 44. In an exemplary embodiment, molybdenum is deposited to form the bottom electrode. Thereafter, the MEMS device layer 40 is deposited over the bottom electrodes 45 and the dielectric layer 16. Then, a top electrode 46 is formed over the MEMS device layer 40. For exemplary, molybdenum may be deposited and patterned to form a top electrode 46 in each region 41, 42, 43 and 44.

Other MEMS structure layers may be deposited over the MEMS device layer 40 to form desired structures. For example, in regions 42 and 44, a shunt loading layer 47 is formed over the top electrode 46. In regions 41 and 42, a filter loading layer 48 is formed over the top electrode 46. Additional sacrificial material may be deposited over the MEMS device structure layers and etch as desired for the formation of the shielding structure 30.

A dielectric shielding layer 32 is formed over the MEMS structure 20 in regions 41 and 42, and another dielectric shielding layer 32 is formed over the MEMS structure 20 in regions 43 and 44. Likewise, a metallic shield layer 34 is formed over each dielectric shielding layer 32. Further, a sealing layer 36 is formed over each metallic shield layer 34. As a result, MEMS structures 20 are shielded at the system level, i.e., as filters or duplexers, from an adjacent system.

A similar structure of a portion of an integrated circuit 8 is shown in FIG. 3, in which resonator MEMS structures 20 are individually shielded by shielding structures 30 in regions 51, 52, 53, and 54. FIG. 4 is an overhead schematic of the structure of FIG. 3. As shown, each shielding structure 30 is grounded by a ground line 56. Further, each ground plane 26 is grounded by a ground line 58. The ground planes 26 in the embodiment of FIGS. 3 and 4 are contiguous layers having a rectangular shape. In the embodiment of FIGS. 3 and 4, formation of ground planes 26 may include etching the substrate 12 to form trenches, and filling the trenches with a conductive material such as metal, such as in FIG. 1. Alternatively, the ground planes 26 may be formed according to the embodiments of FIG. 18 or 19.

FIG. 5 provides a cross section and FIG. 6 provides an overhead schematic of another embodiment of an integrated circuit 8. In FIGS. 5-6, the ground plane 26 in each region 51, 52, 53 and 54 is ring-shaped or annular, such that a central void 59 is formed within each ground plane 26. In an exemplary embodiment, the central void 59 is filled by a portion of the substrate 12. For example, a ring-shaped trench may be formed in the substrate 12, and the ring-shaped trench filled with the conductive material to form the ring-shaped ground plane 26.

FIGS. 7 and 8 illustrate another embodiment of a portion of an integrated circuit 8 in which resonator MEMS structures 20 are individually shielded by shielding structures 30 in regions 51, 52, 53, and 54. Unlike the embodiment of FIGS. 1 and 3-6, the embodiment of FIGS. 7 and 8 includes a blanket deposited MEMS device layer 40 remaining overlying the dielectric layer 16 and a sealing layer 36 blanket deposited over the MEM device layer 40.

Further, as shown in FIG. 8, each ground plane 26 is formed in a cage or grid shape, i.e., with a plurality of openings 92. In the illustrated embodiment, each ground plane 26 is formed with eight openings, although more or fewer openings could be provided in other embodiments. Such ground planes 26 are suitable for forming a conductive enclosure surrounding and encapsulating the MEMS structure 20 along with the conductive pillars 28 and metallic shield 34. Formation of such ground planes 26 may include etching the substrate 12 to form trenches surrounding islands of upper portions 93 of substrate 12, and filling the trenches with a conductive material such as metal. As a result, the openings 92 are formed by the non-etched upper portions 93 of substrate 12. In the embodiment of FIGS. 7 and 8, each cage-shaped ground plane 26 is grounded by a ground line 58 and each shielding structure 30 is grounded by a ground line 56.

FIG. 9 illustrates an alternate embodiment of the shielding structure 30 of FIG. 8. The structure of FIG. 9 includes a ground plane 26 similar to that of FIG. 8, i.e., cage or grid shaped. In FIG. 9, the shielding structure 30 is also cage-shaped. Specifically, the shielding structure 30 is formed with a plurality of openings 31. In the illustrated embodiment, each shielding structure 30 is formed with eight openings, although more or fewer openings could be provided in other embodiments. Such shielding structure 30 are suitable for forming a conductive enclosure surrounding and encapsulating the MEMS structure 20 along with the conductive pillars 28 and ground plane 26. In the embodiment of FIGS. 7 and 9, each cage-shaped shielding structure 30 is grounded by a ground line 56 and each ground plane 26 is grounded by a ground line 58.

FIGS. 10 and 11 illustrate another embodiment of a shielding structure 30. Again, a portion of an integrated circuit 8 includes resonator MEMS structures 20 that are individually shielded by shielding structures 30 in regions 51, 52, 53, and 54. Similar to the embodiment of FIGS. 7 and 8, the embodiment of FIGS. 10 and 11 includes a blanket deposited MEMS device layer 40 remaining overlying the dielectric layer 16 and a sealing layer 36 blanket deposited over the MEM device layer 40.

In FIGS. 10 and 11, each ground plane 26 is annular is ring-shaped or annular, such that a central void 59 is formed within each ground plane 26, similar to FIGS. 5 and 6. In an exemplary embodiment, the central void 59 is filled by a portion of the substrate 12. For example, a ring-shaped trench may be formed in the substrate 12, and the ring-shaped trench filled with the conductive material to form the ring-shaped ground plane 26.

FIGS. 1-11 illustrate embodiments in which shielded MEMS devices 10 are formed over bulk wafer type substrates 12. FIGS. 12-13 and 20-21 illustrate that such shielded MEMS devices 10 may be formed over an SOI substrate 12, such as in RFSOI processing. FIGS. 12 and 20 illustrate resonator-level shielding of MEMS structures 20 while FIGS. 13 and 21 illustrate system-level shielding of MEMS structures 20. In FIGS. 12-13 and 20-21, a base substrate 60 is formed with an overlying insulator layer 62. A device layer 64 overlying the insulator layer 62 is formed from a semiconductor material and includes devices such as CMOS devices. Conductive interconnect layers 66 are selectively formed over the device layer 64 and terminate at an uppermost metal layer that also forms the ground plane 26 for the shielded MEMS devices 10. As shown, the dielectric layer 16 is formed on the ground plane 26 and substrate 12 as in previously-described embodiments.

In addition to the electromagnetic (EM) shielding structures 30 of FIGS. 1-11, the embodiments of FIGS. 12-13 and 20-21 also include acoustic shielding structures 70. In exemplary embodiments, a portion of an integrated circuit 8 may include a MEMS device 20 with only an acoustic shielding structure 70. As shown in FIGS. 12-13 and 20-21, each MEMS structure 20 defines a footprint 71 of the substrate 12. The acoustic shielding structures 70 are located over the substrate 12 outside of the footprint 71 of the MEMS structures 20.

Structurally, the acoustic shielding structures 70 include a dielectric support 76. An exemplary dielectric support 76 is formed from the MEMS device layer 40. For example, an exemplary dielectric support 76 may be aluminum nitride (AlN). To form the dielectric support 76, the MEMS device layer 40 may be etched outside the footprint 71 of the MEMS device 20 to form vias during patterning of the MEMS device layer 40 within the footprint 71 for MEMS device 20 formation. The dielectric support 76, including vias, forms the acoustic shielding structures 70.

As shown, ground planes 26 for the acoustic shielding structures 70 are formed outside of the footprint 71. In the embodiment of FIGS. 12-13, vias are etched through the dielectric layer 16 and filled with conductive material to form conductive pillars 72. In an exemplary embodiment, the conductive pillars 72 are metal, such as tungsten or copper, other suitable conductive materials, or combination thereof. Further, in the exemplary embodiment, the conductive pillars 72 are formed as an array of radially spaced conductive pillars 72, i.e., radially spaced in the context of distance from a device axis 73.

In an exemplary embodiment of FIGS. 12-13, the acoustic shielding structures 70 include seal rings formed from materials used to form the MEMS structures 20. For example, a conductive plate 74 is formed over the dielectric layer 16 and in electrical contact with the conductive pillars 72. An exemplary conductive plate 74 is formed from the material used to form the bottom electrode 45. An exemplary conductive plate 74 is molybdenum. As shown, the dielectric support 76 is formed over the conductive plate 74 and etched to form vias therein. Then, a conductive layer 78 is formed over the dielectric support 76. An exemplary conductive layer 78 is formed from the material used to form the top electrode 46. An exemplary conductive layer 78 may be molybdenum. As shown, during deposition of the material for forming the top electrode 46, the same material forms the conductive layer 78 and fills the etched vias in the MEMS device layer 40 to form an array of linear conductive elements 79, e.g., rods. The conductive material of the conductive elements 79 modifies the acoustic/phononic properties of the shielding structure 70. As a result, the shielding structure 70 may be formed with desired acoustic/phononic properties by adjusting properties of the conductive elements 79.

The exemplary acoustic shielding structure 70 is a three-dimensional periodic structure. The periodic structure 70 is provided with the proper symmetry and local contrast modulation of the acoustic index to divert an incident shock wave, such as one propagated along sealing layer 36, by using constructive/destructive interference phenomena that produce a "band gap" in the transmission spectrum of the periodic structure 70. In the embodiment of FIGS. 12-13, the periodic structure 70 includes a first media, formed by the linear conductive elements 79, and a second media formed by the dielectric support 76 surrounding the linear conductive elements 79.

As shown, the dielectric support 76 is formed with vias arranged in a periodic structure positioned between the protected footprint of the MEMS devices 20 and a potential acoustic impact to or from other devices co-planar to the MEMS devices 20, i.e., along horizontal planes of the integrated circuit 8 (planes parallel to the substrate 12). In other words, the acoustic shielding structure 70 may be provided to protect the shielded devices 10 from acoustic energy from other devices and/or to protect other devices from acoustic energy from the MEMS devices 20. The acoustic shielding structure 70 surrounds and encloses, in horizontal planes, the MEMS device 20. Further, the acoustic shielding structure 70 is electrically isolated from and has no electrical contact to the MEMS device 20.

The first and second media (linear conductive elements 79 and dielectric support 76) have different acoustic indices of refraction that provide a local contrast modulation of the acoustic index. The symmetry of the periodic structure 70 and local contrast modulation define a band gap in a transmission spectrum of the periodic structure 70. The first and second media are spaced in the periodic structure 70 to position the band gap coincident with the dominant wavelength of a shock wave produced by the potential acoustic threat. The periodic structure 70 is suitably configured such that the band gap spans the dominant wavelengths incident on the structure for a variety of potential acoustic threats. The dominant wavelength is a function of the pressure of an expected acoustic source, e.g., the shielded MEMS device or other MEMS device, and the range to the acoustic source. Generally speaking, the energy of the incident shock wave that lies within the band gap is substantially reflected by the periodic structure 70.

Unlike the embodiments of FIGS. 12 and 13, the embodiments of FIGS. 20 and 21 do not include conductive pillars 72 through the dielectric layer 16 to contact the ground plane 26. Further, the embodiments of FIGS. 20 and 21 do not include the conductive layer 78 forming an array of linear conductive elements 79.

Because the embodiments of FIGS. 20 and 21 lack the conductive elements 79, conductive layer 78, and conductive pillars 72, the periodic structure 70 is formed only as an acoustic shield, and not as seal ring. Further, the acoustic shielding structure 70 of FIGS. 20 and 21 is formed by the dielectric support 76 formed with vias that are not filled with conductive material. The sealing layer 36 may fill the vias in the dielectric support 76. As a result, the three-dimensional periodic structure formed by the acoustic shielding structure 70 includes a first media, formed by the sealing layer 36, and a second media formed by the dielectric support 76.

FIGS. 14 and 15 provide another embodiment of the acoustic shielding structures 70. Again, the exemplary acoustic shielding structures 70 form seal rings. In FIGS. 14 and 15, each acoustic shielding structure 70 is a periodic structure provided with the proper symmetry and local contrast modulation of the acoustic index to divert an incident shock wave, such as one propagated along MEMS device layer 40, by using constructive/destructive interference phenomena that produce a "band gap" in the transmission spectrum of the periodic structure 70.

In FIGS. 14 and 15, two adjacent shielded MEMS devices 10 are protected by separate acoustic shielding structures 70, that form seal rings individually numbered 81 and 82. The acoustic shielding structures forming seal rings 81 and 82 are simultaneously formed. For example, the MEMS device layer 40 is blanket deposited over the dielectric layer 16 and is patterned during MEMS device 20 formation. During such patterning, vias are etched through the MEMS device layer 40 outside the footprint of the MEMS device 20. During formation of the top electrode 46, a conductive material is deposited over the MEMS device layer 40 to form the top electrode 46 within the footprint and to form linear conductive elements 79. The conductive material may be formed with an overburden portion forming a cap 84 electrically connecting the linear conductive elements 79. Alternatively, a separate conductive layer may be deposited to form the cap 84. It is noted that for purposes of clearly illustrating the structure of the linear conductive elements 79, the cap 84 is not illustrated in FIG. 14.

In FIGS. 14 and 15, it may be seen that the vias and linear conductive elements 79 in the array forming seal ring 81 have different dimensions, i.e., diameter and pitch, as compared to the dimensions of the linear conductive elements 79 in the array forming seal ring 82. The dimensions of linear conductive elements 79 in each array can be tuned based on the acoustic indices of refraction and local contrast modulation of the acoustic index to position the band gap coincident with the dominant wavelength of a shock wave produced by the potential acoustic threat, e.g., an expected acoustic energy produced by the MEMS device 20 surrounded by seal ring 81 and a different expected acoustic energy produced by the MEMS device 20 surrounded by seal ring 82.

As shown in FIG. 15, the conductive elements 79 in the periodic structures 70 in each array are grounded by a connection to ground 86. EM shielding structures 30 are also grounded by connection to ground 56. Further, ground planes 26 are grounded by connection to ground 58. In exemplary embodiments, the seal ring conductive elements 79 are electrically isolated from the MEMS devices 20.

Referring to FIGS. 16 and 17, another embodiment of the acoustic shielding structure 70 is shown. The MEMS devices 20 and EM shielding structure 30 of FIGS. 16 and 17 are the same as that of the embodiment if FIGS. 14 and 15. Further, the MEMS device layer 40 is again blanket deposited over the dielectric layer 16. However, the acoustic shielding structure 70 of FIGS. 16 and 17 does not include a periodic structure including conductive linear elements 79. Rather, the acoustic shielding structure 70 includes an annular trench that may be filled with a solid, contiguous annular layer as seen most clearly in FIG. 17.

As shown in FIG. 16, a trench is etched through the dielectric layer 16 and filled with conductive material to form a conductive pillar 72 in lieu of the array of radially spaced conductive pillars 72 of previously described embodiments. An exemplary conductive pillar 72 is formed with a diameter suitable for electrical connection to the later formed conductive element forming the seal ring of the acoustic shielding structure 70. Further, a trench is etched through the MEMS device layer 40, such as during patterning of the MEMS device layer 40 within the footprint for formation of the MEMS device 20. The trench is annular and surrounds an island 88 of the MEMS device layer 40 on which the MEMS device 20 is located.

In FIGS. 16 and 17, the annular trench is filled with conductive material such as the conductive material deposited during formation of the top electrode 46 in the MEMS devices 20 to form the contiguous annular layer 89 for a seal ring. The conductive material may be formed with an overburden portion forming a cap 84 overlying the annular layer 89. The contiguous annular layer 89 of the seal ring may be formed with a radial thickness 90 that is the same as that of the conductive pillars 72, such as about 4 μm.

As shown in FIG. 17, the conductive layer 89 forming a seal ring is grounded by a connection to ground 86. EM shielding structures 30 are also grounded by connection to ground 56. Further, ground planes 26 are grounded by connection to ground 58. In exemplary embodiments, the conductive layer 89 forming a seal ring is electrically isolated from the MEMS devices 20.

As described herein, methods are provided in which a shielded MEMS device 20 is formed over a substrate by processing a single substrate. Further, MEMS devices 20 are provided with electromagnetic shielding structures 30 and/or acoustic shielding structures 70. Also, combinations of electromagnetic shielding structures and acoustic shielding structures are provided to shield individual MEMS devices or groups of MEMS devices or both. For example, MEMS devices may be protected by electromagnetic shielding structures singly, or in pairs, and simultaneously by acoustic shielding structures in pairs, or in larger groups.

The methods and integrated circuits described herein provide RF MEMS devices with improved magnetic, capacitive, and acoustic isolation while keeping small form factor and reduced footprint due to the described shielding structures.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. An integrated circuit having a shielded MEMS device comprising:
   a substrate;
   a ground plane including conductive material over the substrate;
   a dielectric layer over the ground plane;
   a MEMS device over the ground plane;
   a first conductive pillar through the dielectric layer and in contact with the ground plane;
   a second conductive pillar through the dielectric layer and in contact with the ground plane, wherein the MEMS device is located between the first conducive pillar and the second conductive pillar;
   a metallic film over the MEMS device and in contact with the first and second conductive pillars, wherein the metallic film, first and second conductive pillars and the ground plane form an electromagnetic shielding structure surrounding the MEMS device; and
   an acoustic shielding structure over the substrate and adjacent the electromagnetic shielding structure.

2. The integrated circuit of claim 1 wherein:
   the MEMS device has a footprint,
   each conductive pillar is outside of the footprint of the MEMS device;
   the integrated circuit further comprises a MEMS device layer over the substrate and including a first portion forming part of the MEMS device and a second portion outside of the footprint of the MEMS device; and
   a portion of the metallic film extends through the MEMS device layer outside the footprint.

3. The integrated circuit of claim 1 wherein a lower cavity separates the MEMS device from the ground plane and an upper cavity separates the MEMS device from the metallic film.

4. The integrated circuit of claim 1 further comprising a dielectric shielding layer overlying MEMS device, wherein an upper cavity separates the MEMS device from the dielectric shielding layer, wherein the metallic film is located on the dielectric shielding layer.

5. The integrated circuit of claim 4 further comprising a sealing layer on the metallic film.

6. The integrated circuit of claim 1 wherein the MEMS device has a footprint, and wherein the acoustic shielding structure is formed from a dielectric material patterned to form a periodic structure overlying the dielectric layer outside the footprint.

7. The integrated circuit of claim 6 wherein the first and second conductive pillars are outside of the footprint of the MEMS device, and wherein the integrated circuit further comprises a seal ring formed by:
   a seal ring conductive pillar through the dielectric layer and in electrical connection with the ground plane; and
   a conductive material overlying the dielectric layer, adjacent the electromagnetic shielding structure, and in electrical connection with the seal ring conductive pillar.

8. The integrated circuit of claim 7 wherein:
   the seal ring conductive pillar comprises an array of seal ring conductive pillars through the dielectric layer and in electrical connection with the ground plane; and
   the conductive material overlying the dielectric layer comprises an array of conductive isolation pillars formed in the periodic structure and in electrical connection with the array of seal ring conductive pillars.

9. An integrated circuit having a shielded MEMS device comprising:
   a substrate;
   a ground plane including conductive material over the substrate;
   a dielectric layer over the ground plane;
   a MEMS device over the ground plane and having a footprint; and
   an acoustic shielding structure formed from a dielectric material patterned to form a periodic structure overlying the dielectric layer outside the footprint.

10. The integrated circuit of claim 9 further comprising an electromagnetic shielding structure surrounding the MEMS device and located between the MEMS device and the acoustic shielding structure.

11. The integrated circuit of claim 9 wherein the dielectric material is formed with vias, and wherein the integrated circuit further comprises:
   a conductive pillar located outside the footprint, passing through the dielectric layer, and in electrical connection with the ground plane; and
   a conductive material formed in the vias overlying the dielectric layer, outside the footprint, and in electrical connection with the conductive pillar, and wherein the conductive material adjusts acoustic properties of the acoustic shielding structure.

12. A method for fabricating a shielded MEMS device, the method comprising:
   providing a substrate;
   forming a ground plane including conductive material over the substrate;
   depositing a MEMS device layer over the substrate and forming a MEMS device over the ground plane;
   forming a first conductive pillar in contact with the ground plane;
   depositing a metallic film over the MEMS device and in contact with the first conductive pillar, wherein the metallic film, the conductive pillar and the ground plane form an electromagnetic shielding structure surrounding the MEMS device; and
   forming a seal ring by:
      forming a seal ring conductive pillar in electrical connection with the ground plane; and
      forming a conductive material in the MEMS device layer, in electrical connection with the seal ring conductive pillar, and adjacent the electromagnetic shielding structure.

13. The method of claim 12 wherein forming the MEMS device over the ground plane comprises depositing a MEMS device layer over the substrate.

14. The method of claim 13 wherein:
   the MEMS device has a footprint;
   the first conductive pillar is outside of the footprint of the MEMS device;
   forming the MEMS device over the ground plane comprises patterning the MEMS device layer within the footprint; and
   depositing the metallic film over the MEMS device and in contact with the first conductive pillar comprises forming a portion of the metallic film that extends through the MEMS device layer outside the footprint.

15. The method of claim 12 further comprising forming a CMOS device over the substrate, wherein forming the ground plane including conductive material over the substrate comprises depositing the conductive material over and in selective electrical contact with the CMOS device.

16. The method of claim 12 wherein forming a MEMS device over the ground plane comprises:
   depositing a dielectric layer over the ground plane; and
   etching the dielectric layer to form a lower cavity between the MEMS device and the ground plane.

17. The method of claim 12 further comprising:
   depositing a dielectric shielding layer overlying MEMS device, wherein an upper cavity isolates the MEMS device from the dielectric shielding layer, wherein depositing the metallic film over the MEMS device and in contact with the first conductive pillar comprises depositing the metallic film over the dielectric shielding layer; and
   depositing a sealing layer over the metallic film.

18. The method of claim 12 further comprising forming an acoustic shielding structure over the substrate and adjacent the electromagnetic shielding structure.

19. The method of claim 12 further comprising depositing a dielectric layer over the ground plane, wherein forming the first conductive pillar in contact with the ground plane comprises forming the first conductive pillar through the dielectric layer, and wherein forming the seal ring conductive pillar in electrical connection with the ground plane comprises forming the seal ring conductive pillar through the dielectric layer.

20. The method of claim 12 wherein:
   forming the seal ring conductive pillar comprises forming an array of seal ring conductive pillars in electrical connection with the ground plane; and
   forming the conductive material in the MEMS device layer comprises forming an array of conductive isolation pillars in contact with the array of seal ring conductive pillars.

* * * * *